United States Patent [19]
Kitamura et al.

[11] Patent Number: 5,942,965
[45] Date of Patent: Aug. 24, 1999

[54] MULTILAYER SUBSTRATE

[75] Inventors: Koji Kitamura; Seiichi Takahashi, both of Sagamihara; Koji Nishi; Takayoshi Nishiyama, both of Yokohama, all of Japan

[73] Assignee: Murata Manufacturing Co., Ltd., Japan

[21] Appl. No.: 08/926,816

[22] Filed: Sep. 9, 1997

[30] Foreign Application Priority Data

Sep. 13, 1996 [JP] Japan ................................. 8-248104

[51] Int. Cl.⁶ ...................................................... H01F 5/20
[52] U.S. Cl. ......................... 336/200; 174/255; 336/232
[58] Field of Search .................................. 336/200, 232; 428/901; 174/255

[56] References Cited

U.S. PATENT DOCUMENTS

| | | | |
|---|---|---|---|
| 3,785,046 | 1/1974 | Jennings | 29/602 |
| 4,313,151 | 1/1982 | Vranken | 361/402 |
| 4,313,152 | 1/1982 | Vranken | 361/402 |
| 5,363,081 | 11/1994 | Bando et al. | 336/200 |

FOREIGN PATENT DOCUMENTS 7122430   5/1995   Japan .

OTHER PUBLICATIONS

Dialog English Abstract of Japan Publication No. 7–122430, May 12, 1995.

*Primary Examiner*—Lincoln Donovan
*Assistant Examiner*—Tuyen T. Nguyen
*Attorney, Agent, or Firm*—Ostrolenk, Faber, Gerb & Soffen, LLP

[57] ABSTRACT

When a multilayer substrate is formed by alternately laminating a plurality of substrates having coil patterns and preimpregs including an epoxy resin, and by pressing in the direction of lamination while heating, the epoxy resin is melted and may leak from between the substrates, and may form voids between the coil patterns so as to render the electrical insulation therebetween unsatisfactory. According to the present invention, a fence pattern or another structure is formed around each coil pattern, which substantially prevents leakage of the melted epoxy resin from between the substrates, and therefore, the spaces between the coil patterns remain securely filled with the epoxy resin.

13 Claims, 5 Drawing Sheets

MULTILAYER SUBSTRATE

BACKGROUND OF THE INVENTION

1. Field of the Invention

The present invention relates to multilayer substrates, and more particularly to multilayer substrates having improved electrical breakdown resistance.

2. Description of the Related Art

In general, a multilayer substrate used in electronic equipment is provided with several patterns for control circuits or electric power circuits, and in some cases, a large potential difference may be generated between such circuit patterns.

Conventional multilayer substrates have problems related to their electrical insulation breakdown voltage.

A large potential difference is generated, for example, in a multilayer substrate used for a switching power source. In the following, a multilayer substrate used for a switching power source will be illustrated.

In a switching power source, a switching transformer is used. For a high switching frequency of around several hundred kilohertz, a thin and small transformer comprising a lamination of coil patterns is used as a switching transformer. In some cases of an even higher switching frequency, the transformer is formed within a multilayer substrate since the inductance of the transformer may be small.

Typically, such a transformer comprises a primary coil and a secondary coil, and the primary coil is connected to an input circuit pattern of the switching power source while the secondary coil is connected to an output circuit pattern. In general, a voltage 2 to 3 times the power source voltage is applied to a transformer of a switching power source, and therefore, the potential difference between the coil patterns of the primary coil and the secondary coil in the transformer is extremely large.

As shown in FIGS. 5 and 6, a multilayer substrate used in such a switching power source comprises, for example, substrates 1, 2, 3 and 4, circuit patterns 8 to 15, and preimpregs 5, 6 and 7 which fill the spaces between the substrates and comprise glass fabric bases 5a, 6a and 7a and epoxy resin portions 16, 17 and 18, respectively.

On the front or rear surfaces of the substrates 1, 2, 3 and 4, circuit patterns 8 to 15 including coil patterns and wiring patterns are formed. Further, the substrates 1, 2, 3 and 4 are laminated with the intervention of the insulating preimpreg layers 5, 6, and 7, which respectively comprise glass fabric bases 5a, 6a and 7a and epoxy resin portions 16, 17 and 18 which are cured while combined with the glass fabric bases 5a, 6a and 7a.

For each substrate 1, 2, 3 or 4, a glass-epoxy laminate plate or the like is used which may have a thickness of, for example, 100 $\mu$m. Further, each of the circuit patterns 8 to 15 is formed, for example, by etching copper foil which is deposited on the front or rear surface of the substrate 1, 2, 3, or 4 and has a thickness of around 35 to 70 $\mu$m. As occasion demands, the circuit patterns formed on the front or rear surfaces of the substrates 1, 2, 3 and 4 are connected by providing through-holes. The coil patterns are connected in series to the coil patterns in other laminated layers through through-holes in order to increase the turn number of the resulting coil. The turn number of the coil is determined depending on the intended properties of the transformer.

With reference to FIG. 5, a method for producing a multilayer substrate will be schematically. illustrated below.

Substrates 1, 2, 3 and 4 having circuit patterns 8 to 15 formed on their front or rear surfaces and preimpregs 5, 6 and 7 are alternately laminated, respectively. The preimpregs 5, 6 and 7 are thin sheets respectively comprising glass fabric bases 5a, 6a and 7a in which an epoxy resin is incorporated and half cured.

The thus laminated substrates 1, 2, 3 and 4 and preimpregs 5, 6 and 7 are pressed in the direction of lamination, and the whole laminate is heated. As a result, the epoxy resin is melted and then cured, so that the substrates 1, 2, 3 and 4 adhere one upon another, and thus a multilayer substrate is formed, as shown in FIG. 6. Hereupon, since the epoxy resin wraps the circuit pattern 9 to 14 inside the laminate and fills the spaces between the substrates 1, 2, 3 and 4, electrical insulation therebetween is secured.

The above-mentioned problems with electrical insulation breakdown voltage are believed to arise because of the apparatus and methods used for manufacturing the conventional multilayer substrate.

In general, in order to achieve such a multilayer structure, a so-called vacuum lamination-molding molding press machine is used. In this apparatus, the pressing part can be entirely sealed for ambient pressure reduction, whereby pressing and heating can be carried out under a reduced pressure.

More specifically, substrates and preimpregs to be laminated are fixed in such an apparatus by a jig, the entire pressing part of the apparatus is then sealed and depressurized, and the substrates and preimpregs are heated to approximately 170 to 180° C. and pressed in the direction of lamination under a pressure of 30 to 40 kg/cm$^2$. The degree of vacuum in the depressurized pressing part is set at 13,332 Pa or less, and heating is performed for 70 to 90 min. while pressing is performed for 15 to 20 min.

The epoxy resin included in the preimpregs exhibits a minimum melt-viscosity at around 130° C. in the heating step, and starts to harden above such a temperature. Due to these characteristics, the epoxy resin having a viscosity lowered by heating frequently leaks out from the spaces between the substrates during lamination of the substrates. As a result, voids are generated between the substrates, and the insulation breakdown voltage between the layers is thereby lowered.

In particular, as shown in FIG. 7, when such a void 19 is generated in an insulating layer 22 between coil patterns of a primary coil 20 and a secondary coil 21 in a transformer which requires a high electrical insulation breakdown voltage, the electrical insulation breakdown voltage between the coil patterns may be unsatisfactory.

A similar reduction in electrical insulation breakdown voltage may also occur between a pattern of a power source circuit at a high potential and a pattern of a control circuit at a low potential which are connected to the coil patterns.

Various attempts have been made to solve the above-described problems. For example, for manufacturing the pair of substrates 23 and 24 shown in FIG. 7, a rectangular-frame-shaped pattern (not shown) is formed on the rear surface of the substrate 23 and the front surface of the substrate 24 along the peripheries of the substrates 23 and 24 so as to surround all the circuit patterns formed thereon, for preventing leakage of the melted epoxy resin from between the substrates 23 and 24. The known leakage preventing pattern is not part of the circuit patterns in the multilayer substrate as it is removed after the substrates are laminate.

The known leakage preventing pattern can prevent void generation in the case of a small-size multilayer substrate. However, when a multilayer substrate is produced having a large size or including circuit patterns having complicated shapes, heat and pressure applied for production of the multilayer substrate are unevenly transferred into the component substrates. Due to this, the melted epoxy resin is rarely evenly distributed in the spaces between the component substrates, and local voids are readily generated. In particular, when such a void is generated between coil patterns in a transformer exhibiting an extremely large potential difference, or between a high-potential circuit pattern and a low-potential circuit pattern, the electrical insulation breakdown voltage of the multilayer substrate is unsatisfactory.

SUMMARY OF THE INVENTION

The present invention has been accomplished in view of the above-described problems in the related art, and is able to provide a multilayer substrate which exhibits satisfactory insulation at least in the portion of the multilayer substrate where a large potential difference may exist between circuit patterns.

In order to achieve the above-described result, a first aspect of the present invention is a multilayer substrate comprising a plurality of substrates laminated into a multilayer structure, and at least one interlayer circuit pattern including at least one coil pattern, wherein said multilayer substrate further comprises at least one fence pattern surrounding at least said coil pattern.

According to this aspect, since the coil pattern is surrounded with the fence pattern, running of the epoxy resin contained in a preimpreg is stopped by the fence pattern. The epoxy resin, therefore, is substantially prevented from leaking outside the fence pattern even if melted, which in this context means that substantially no void is generated around the coil pattern between the laminated substrates. As a result, a satisfactory insulation breakdown voltage around the coil pattern can be maintained.

A second aspect of the present invention is a multilayer substrate comprising a plurality of substrates laminated into a multilayer structure, and at least one high-potential circuit pattern and at least one low-potential circuit pattern, between which a potential difference may be generated, wherein said multilayer substrate further comprises at least one fence pattern surrounding said high-potential circuit pattern.

According to this aspect, since the high-potential circuit pattern in the region where a large potential difference may be generated is surrounded by the fence pattern, running of the epoxy resin contained in a preimpreg is stopped by the fence pattern, and therefore, the epoxy resin is substantially prevented from leaking outside the fence pattern even if melted, which in this context means that substantially no void is generated between the high-potential and low-potential circuit patterns. Additionally, since the movement of the epoxy resin is obstructed, no void is generated in the circuit pattern portion where a large potential difference is generated. As a result, a satisfactory insulation breakdown voltage can be maintained in the circuit pattern portion of the multilayer substrate where a large potential difference is generated.

A third aspect of the present invention is a multilayer substrate with the features described above in connection with either the first or the second aspect, wherein the fence pattern is connected to a circuit pattern other than the circuit pattern surrounded by the fence pattern. The fence pattern may be connected to the other circuit pattern by a connecting pattern.

In this multilayer substrate, since the fence pattern is connected to a predetermined circuit pattern outside the fence pattern, the fence pattern is free from electrical isolation. Further, heat generated in external electronic parts is transferred to the fence pattern through the connecting pattern, and is diffused inside the multilayer substrate.

DESCRIPTION OF EMBODIMENTS OF THE INVENTION

The present invention will be further illustrated with embodiments below.

EMBODIMENT 1

Figure 1:
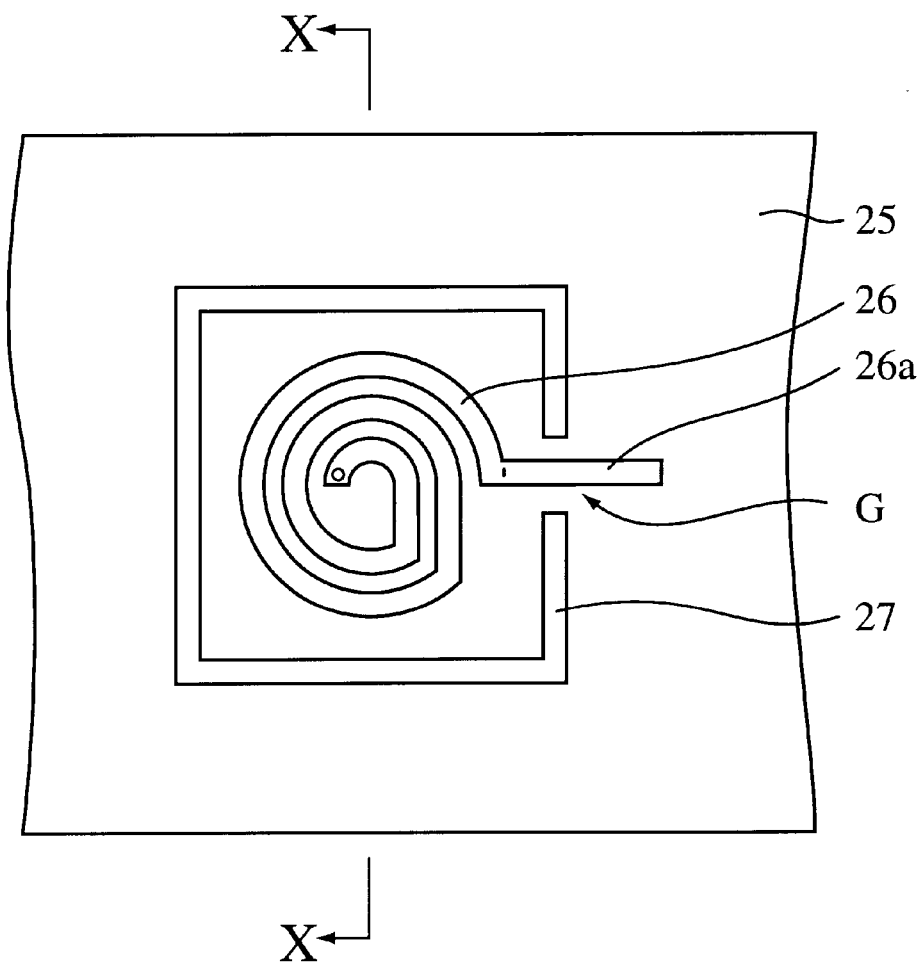
FIG. 1 is a plan view showing a coil pattern portion of a multilayer substrate according to a first embodiment of the present invention, said multilayer substrate being used in a switching power source.
Figure 2:
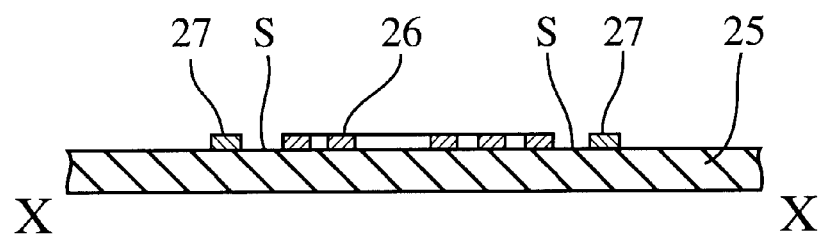
FIG. 2 is a schematic sectional view of FIG. 1 taken along the line X—X.

FIGS. 1 and 2 show one substrate 25 which is contained inside a multilayer substrate, a coil pattern 26 thereon which is a part of an overall circuit pattern, and the surrounding area thereof. The coil pattern 26 is formed in the shape of an eddy, and the inner end of the coil pattern 26 is connected to a circuit pattern on the reverse surface of the substrate or another layer through a through-hole as shown. Meanwhile, the external end of the coil pattern 26 is seamlessly connected to a leading pattern 26a. The leading pattern 26a is connected to another circuit pattern through another through-hole (not shown).

Around the coil pattern 26, a fence pattern 27 having, for example, the shape of a rectangular frame is formed so as to substantially surround the coil pattern. The fence pattern 27 is opened at an opening G corresponding to the leading pattern 26a so as not to be in contact with the leading pattern 26a. The fence pattern 27 is formed together with the coil pattern 26 by etching copper foil deposited on the front and rear surface of the substrate 25. Hereupon, the thickness of the fence pattern 27 is the same as that of the circuit pattern. The width of the fence pattern 27 and the width of its opening G are narrowed to a degree necessary for satisfactorily preventing running and movement of an epoxy resin, and a space S is provided between the fence pattern 27 and coil pattern 26. This space S is filled with the epoxy resin during the process of producing the multilayer substrate.

The substrate 25 is formed with a glass-epoxy laminate plate or the like having a thickness of, for example, 100 μm. The circuit pattern, the fence pattern and the leading pattern are formed with copper foil having a thickness of approximately 35 to 70 μm.

Figure 2A:
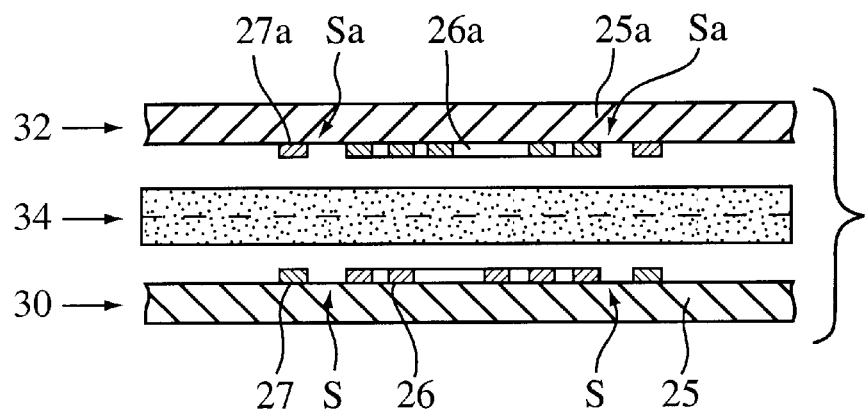
FIG. 2A is an exploded schematic sectional view showing the coil pattern portion of FIG. 1, a meltable insulation material and a second coil pattern portion which together form a multilayer substrate.
Figure 3:
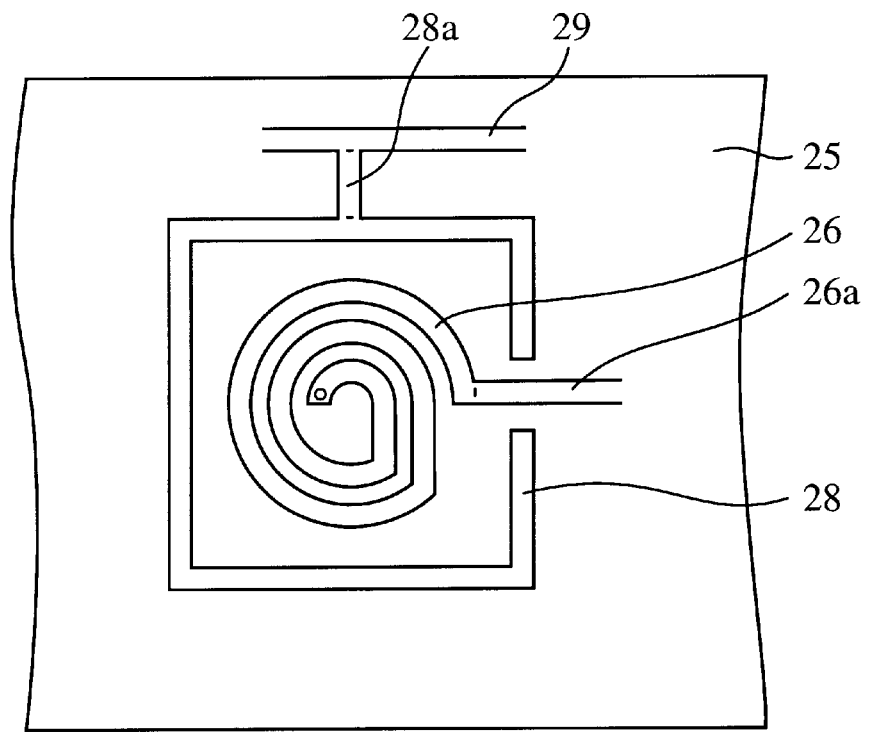
FIG. 3 is a plan view showing a coil pattern portion of a multilayer substrate according to a second embodiment of the present invention, said multilayer substrate being used in a switching power source.

FIG. 2A is an exploded schematic sectional view showing the coil pattern portion of FIG. 1, a meltable insulation material and a second coil pattern portion which together form a multilayer substrate.

In FIG. 2A, a coil pattern portion 30 comprises a substrate 25, coil pattern 26, and fence pattern 27. These elements define the space S and are similar or identical to those shown in FIGS. 1–2. The second coil pattern portion 32 comprises a substrate 25a, a coil pattern 26a and a fence pattern 27a, which define a space Sa. The elements in the portions 30 and 32 may correspond in shape to each other. Disposed between the coil pattern portions 30 and 32 is an insulating preimpreg 34 which in this embodiment may be similar or identical to the preimpregs 5, 6 and 7 discussed hereinabove.

Next, a method for producing a multilayer substrate according to the first embodiment will be briefly illustrated.

Substrates having circuit patterns thereon and preimpregs are alternately laminated one upon another, pressed in the direction of lamination, and the whole laminate is heated. As a result, the epoxy resin in the preimpregs is melted and then hardened, and the adjacent substrates mutually adhere to form a multilayer substrate. Ordinarily, the multilayer substrate comprises 6 to 10 substrates, and has a thickness of approximately 1.5 to 2.0 mm.

During the thermosetting process, although the epoxy resin in the preimpregs is melted and has fluidity, the running of epoxy resin is prevented by the fence pattern 27 formed around the coil pattern 26, and therefore, the epoxy resin in the portion of the coil pattern 26 is substantially prevented from leaking outside the fence pattern 27.

Accordingly, void generation due to leakage or transfer of the epoxy resin does not occur, and therefore, satisfactory electrical insulation breakdown voltage can be secured in the coil pattern portion.

Incidentally, the multilayer substrate according to the present invention is not limited to the above-described embodiment, and several modifications also fall within the scope of the present invention. For example, the shape of the fence pattern may be circular to better match the shape of the coil pattern. Or, the thickness of the fence pattern may be thicker than that of the coil pattern.

Further, although the above-described embodiment is said to provide electrical insulation between oppositely formed coil patterns, similar electrical insulation can be secured between a high-potential circuit pattern and a low-potential circuit pattern which are formed on the front and rear surfaces of a component substrate, respectively. Due to this, such circuit patterns do not have to be located distant from each other, although hitherto a high-potential circuit pattern has had to be disposed distant from a low-potential circuit pattern in order to secure electrical insulation therebetween. As a result, the size of the multilayer substrate can be reduced.

EMBODIMENT 2

The multilayer substrate of Embodiment 2 is characterized in that the fence pattern 28 is connected to a circuit pattern 29 other than the coil pattern 26. Since other characteristics are the same as Embodiment 1, only a brief description will be given below.

A coil pattern 26 is formed in the shape of an eddy, and the inner end of the coil pattern 26 is connected to a circuit pattern on the reverse surface of the substrate or another layer through a through-hole as shown. Meanwhile, the external end of the coil pattern 26 is seamlessly connected to a leading pattern 26a. The leading pattern 26a is connected to another circuit pattern through a through-hole (not shown).

Around the coil pattern 26, a fence pattern 28 is formed so as to substantially surround the coil pattern. The fence pattern 28 is opened at a location corresponding to the leading pattern 26a so as not to be in contact with the leading pattern 26a. The fence pattern 28 is seamlessly connected to a connecting pattern 28a, and this connecting pattern 28a is connected to a circuit pattern 29 other than the coil pattern 26 but on the same layer. According to this manner, the fence pattern can be free from electrical isolation, and maintained at a predetermined potential equal to that of the circuit pattern 29.

In this Embodiment, the connecting pattern 28a transmits heat generated in electronic parts mounted around the connecting pattern 28a to the fence pattern 28. The transmitted heat diffuses in the multilayer substrate through each fence pattern 28. Due to this, in the multilayer substrate, heat generated in electronic parts does not locally accumulate, so the malfunction of electronic circuits and a reduction in the operating life of electronic parts can be prevented.

EMBODIMENT 3

Instead of forming the fence pattern 28 as shown, another type of pattern having similar effects may be formed around the coil pattern 26. An example of such a pattern will be illustrated below with reference to FIG. 4(b).

Figure 4A:
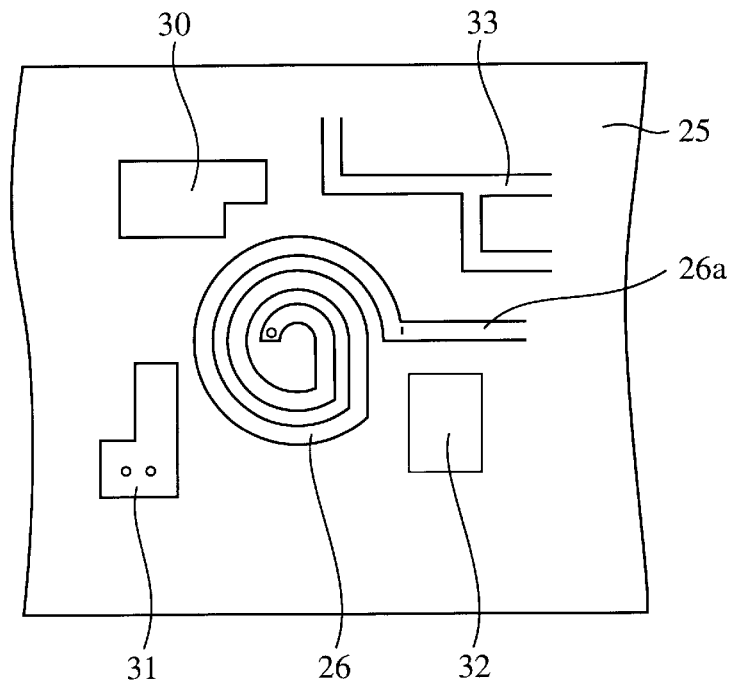
FIG. 4(a) is a plan view showing a coil pattern portion of a conventional multilayer substrate used in a switching power source.
Figure 4B:
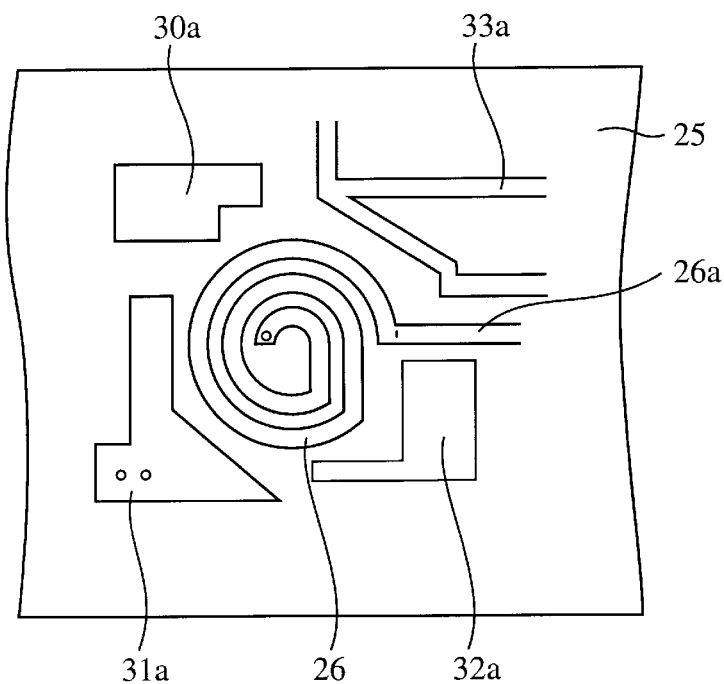
FIG. 4(b) is a plan view showing such a multilayer substrate according to a third embodiment of the present invention.
Figure 5:
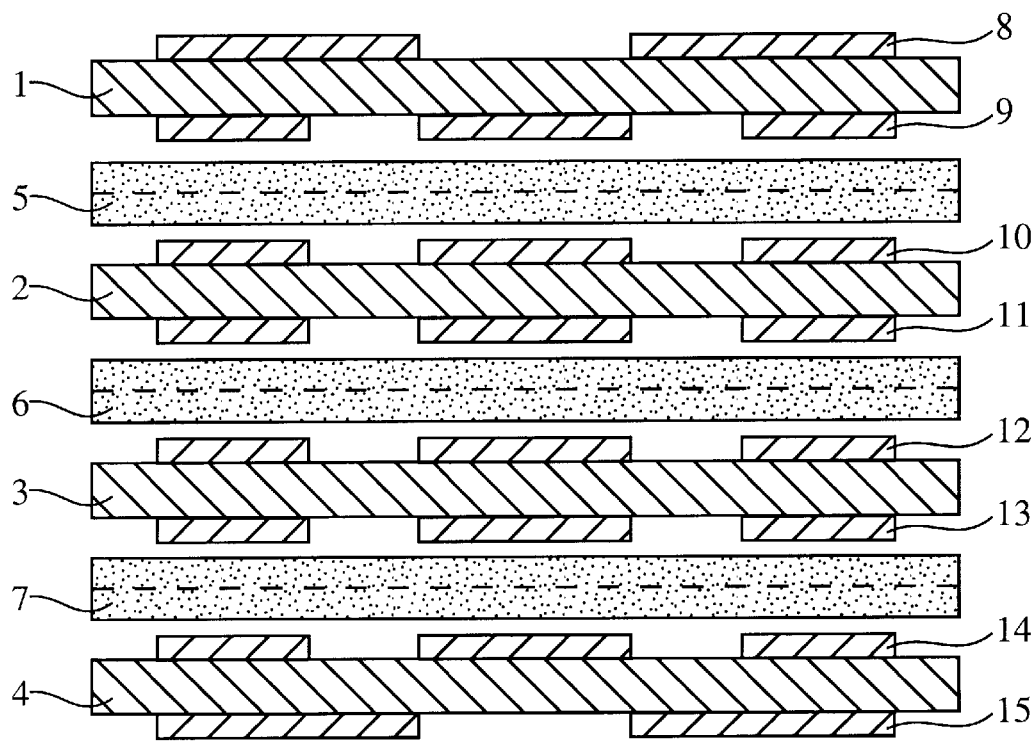
FIG. 5 is an exploded schematic sectional view showing a method for producing a conventional multilayer substrate for a switching power source.
Figure 6:
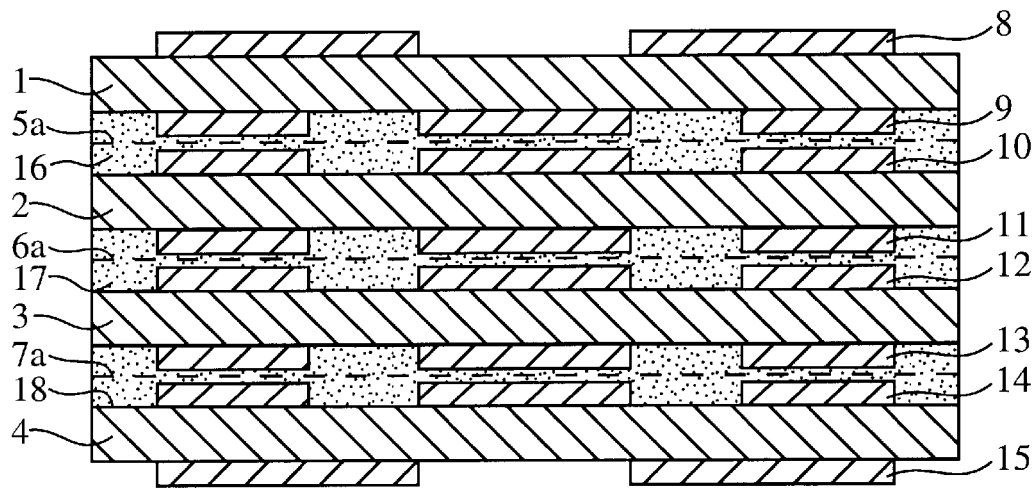
FIG. 6 is a schematic sectional view showing the conventional multilayer substrate of FIG. 5.
Figure 7:
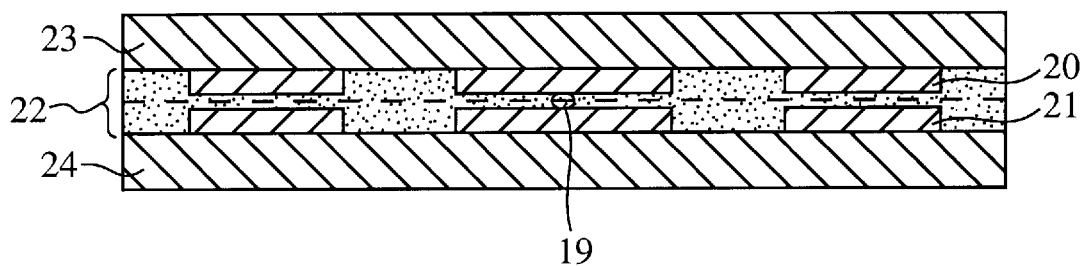
FIG. 7 a schematic sectional view showing another conventional multilayer substrate for a switching power source, said multilayer substrate having a void in a coil pattern portion.

Conventionally, around a coil pattern 26, for example, structures such as lands 30, 31 and 32 and a wiring pattern 33 are designed and disposed as shown in FIG. 4(a). In this third embodiment, however, lands 30a, 31a and 32a and a wiring pattern 33a having enlarged or modified shapes are disposed adjacent to the coil pattern 26 as shown in FIG. 4(b). As a result, the coil pattern 26 is substantially surrounded by the lands 30a, 31a and 32a and the wiring pattern 33a, similarly to Embodiment 2 where the fence pattern 28 is provided. Accordingly, the melted epoxy resin in the vicinity of the coil pattern 26 rarely leaks outside the coil pattern 26, and effects can be achieved similar to those obtained by providing a fence pattern 28.

As described above, in the multilayer substrate of the disclosed embodiments of the present invention, fence patterns are provided so as to surround circuit patterns where large potential differences may exist. Accordingly, void generation in preimpregs can be prevented at least in the portions of such circuit patterns having large potential differences, and electrical insulation can be secured in those portions. Due to this, the electrical breakdown voltage of the multilayer substrate can be maintained at a satisfactory value, and therefore, electrical reliability of the multilayer substrate can be improved and the yield of final products can be also improved.

The multilayer substrate of the present invention can be used for, for example, coils in transformers, inductors or motors which require high electrical insulation breakdown voltage, and coils installed in PC cards.

What is claimed is:

1. A multilayer substrate comprising;

a plurality of laminated substrates, a circuit pattern on one of said substrates, said circuit pattern including at least one coil pattern, a meltable insulation material disposed adjacent to said coil pattern, and a fence pattern on said one of said substrates substantially surrounding said coil pattern while being disconnected from said coil pattern, said fence pattern projecting from said one of said substrates so as to contain the meltable insulation material when melted and thereby substantially prevent formation of voids in said meltable insulation material due to said material flowing away from said circuit pattern.

2. A multilayer substrate according to claim 1, further comprising an additional pattern on said one substrate, wherein said fence pattern surrounds substantially only said coil pattern and not said additional pattern.

3. A multilayer substrate according to claim 1, wherein said fence pattern is disposed within the periphery of said substrate.

4. A multilayer substrate according to claim 1, wherein said fence pattern is connected to a circuit pattern other than said coil pattern.

5. A multilayer substrate according to claim 4, wherein said fence pattern is connected to said circuit pattern by a connecting pattern.

6. A multilayer substrate comprising:

a plurality of laminated substrates, a circuit pattern on one said substrate, a meltable insulation material adjacent to said circuit pattern, and means on said one substrate for containing said meltable insulation material when melted and thereby substantially preventing formation of voids in said meltable insulation material due to said material flowing away from said circuit pattern when melted; wherein said means comprises a fence pattern projecting from said substrate which substantially surrounds said circuit pattern while being disconnected from said circuit pattern.

7. A multilayer substrate according to claim 6, further comprising an additional pattern on said one substrate, wherein said fence pattern surrounds substantially only said circuit pattern and not said additional pattern.

8. A multilayer substrate according to claim 1, wherein a portion of said coil pattern passes through a gap in said fence pattern, said gap being sufficiently narrow to contain the meltable insulation material when melted and thereby substantially prevent formation of voids in said meltable insulation material due to said material flowing away from said circuit pattern.

9. A multilayer substrate according to claim 3, wherein a portion of said coil pattern passes through a gap in said fence pattern, said gap being sufficiently narrow to contain the meltable insulation material when melted and thereby substantially prevent formation of voids in said meltable insulation material due to said material flowing away from said circuit pattern.

10. A multilayer substrate according to claim 6, wherein said circuit pattern includes a coil pattern, and a portion of said coil pattern passes through a gap in said fence pattern, said gap being sufficiently narrow to contain the meltable insulation material when melted and thereby substantially prevent formation of voids in said meltable insulation material due to said material flowing away from said circuit pattern.

11. A multilayer substrate according to claim 1, wherein said meltable insulation material is sandwiched in direct contact between said one substrate and an adjacent substrate.

12. A multilayer substrate according to claim 3, wherein said meltable insulation material is sandwiched in direct contact between said one substrate and an adjacent substrate.

13. A multilayer substrate according to claim 6, wherein said meltable insulation material is sandwiched in direct contact between said one substrate and an adjacent substrate.

* * * * *